US010471602B2

(12) United States Patent
Ko et al.

(10) Patent No.: US 10,471,602 B2
(45) Date of Patent: Nov. 12, 2019

(54) MAGAZINE TRANSFER UNIT GRIPPER

(71) Applicant: SAMSUNG ELECTRONICS CO., LTD., Suwon-si, Gyeonggi-Do (KR)

(72) Inventors: Jong Seong Ko, Suwon-si (KR); Kwang-Jun Kim, Ansan-si (KR); Jung Jun Park, Hwaseong-si (KR); Hee Yun Choi, Namyangju-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/018,171

(22) Filed: Jun. 26, 2018

(65) Prior Publication Data
US 2019/0176339 A1  Jun. 13, 2019

(30) Foreign Application Priority Data
Dec. 11, 2017  (KR) .................. 10-2017-0168939

(51) Int. Cl.
| B25J 11/00 | (2006.01) |
| B25J 9/04 | (2006.01) |
| B25J 13/08 | (2006.01) |
| H01L 21/687 | (2006.01) |
| B25J 19/02 | (2006.01) |
| B25J 15/10 | (2006.01) |

(52) U.S. Cl.
CPC ........... B25J 11/0095 (2013.01); B25J 9/046 (2013.01); B25J 13/089 (2013.01); B25J 15/10 (2013.01);

(Continued)

(58) Field of Classification Search
CPC ............... B25J 15/0052; B25J 15/0061; B25J 15/0066; B25J 15/0057; B25J 15/04;
(Continued)

(56) References Cited

U.S. PATENT DOCUMENTS 8,602,470 B2 * 12/2013 Bieler .................... B25J 15/026
  294/119.1
8,684,432 B2 * 4/2014 Saka ........................ B25J 15/08
  294/119.1
(Continued)

FOREIGN PATENT DOCUMENTS

| JP | 19930190648 | 7/1993 |
| JP | 2016144863 | 8/2016 |

(Continued)

*Primary Examiner* — Stephen A Vu
(74) *Attorney, Agent, or Firm* — F. Chau & Associates, LLC

(57) ABSTRACT

A gripper includes a body frame mounted on a magazine transfer robot. A first guide assembly is mounted on the body frame. A first gripping unit is movable along the first guide assembly. A second gripping unit is movable along the first guide assembly. A driver is configured to move the first gripping unit in a first direction. The driver is configured to move the second gripping unit in a second direction opposite to the first direction. The first gripping unit includes a first finger unit and a second finger unit independently moveable with respect to the first finger unit. The second gripping unit is spaced apart from the first gripping unit. The second gripping unit includes a third finger unit and a fourth finger unit independently moveable with respect to the third finger unit.

19 Claims, 18 Drawing Sheets

(52) U.S. Cl.
CPC ...... *B25J 19/022* (2013.01); *H01L 21/68707* (2013.01)

(58) Field of Classification Search
CPC .. B25J 15/0408; B25J 15/0433; B25J 15/045; B25J 15/0458; B25J 15/0253; B25J 15/0616; B25J 9/08; B25J 11/0095; B25J 9/046; B25J 13/089; B25J 19/022; B25J 15/10; Y10S 483/901; Y10S 901/30; Y10S 901/41; H01L 21/68707
See application file for complete search history.

(56) References Cited

U.S. PATENT DOCUMENTS

| | | | | |
|---|---|---|---|---|
| 8,910,985 | B2* | 12/2014 | Neeper | B25J 9/102 294/119.1 |
| 8,939,487 | B2* | 1/2015 | De Koning | B25J 15/02 294/119.1 |
| 8,960,747 | B2* | 2/2015 | Steffensen | B66F 11/00 294/67.5 |
| 9,156,170 | B2* | 10/2015 | Shiomi | B25J 15/0028 |
| 9,656,394 | B2 | 5/2017 | Lin et al. | |
| 2017/0225326 | A1 | 8/2017 | Akaha et al. | |

FOREIGN PATENT DOCUMENTS

| | | |
|---|---|---|
| JP | 2016172296 | 9/2016 |
| JP | 2016209936 | 12/2016 |
| JP | 2016209992 | 12/2016 |
| KR | 10-1725871 | 4/2017 |
| KR | 1020170042754 | 4/2017 |
| KR | 1020170044179 | 4/2017 |
| WO | 2016051746 | 4/2016 |
| WO | 2016063314 | 4/2016 |

\* cited by examiner

MAGAZINE TRANSFER UNIT GRIPPER

CROSS-REFERENCE TO RELATED APPLICATION

This application claims priority under 35 USC § 119 to Korean Patent Application No. 10-2017-0168939 filed on Dec. 11, 2017 in the Korean Intellectual Property Office, the disclosure of which is incorporated by reference herein in its entirety.

1. Technical Field

Exemplary embodiments of the present inventive concept relate to a gripper, and more particularly to a gripper of a magazine transfer unit.

2. Discussion of Related Art

During processes of fabricating a semiconductor, wafers or printed circuit boards may be transferred by being loaded in a magazine. Such a magazine may be moved using, for example, an overhead hoist transport (OHT), an automated guided vehicle (AGV), or a rail guided vehicle (RGV).

Thus, a magazine having printed circuit boards loaded therein may be moved by the OHT. If a magazine having printed circuit boards loaded therein deviates from a desired position, a taper pin may become stuck when the magazine is moved by the overhead hoist transport (OHT).

SUMMARY

According to an exemplary embodiment of the present inventive concept, a gripper may adaptively grasp a magazine to be moved even if the magazine deviates from a desired position.

According to an exemplary embodiment of the present inventive concept, a gripper includes a body frame mounted on a magazine transfer robot. A first guide assembly is mounted on the body frame. A first gripping unit is movable along the first guide assembly. A second gripping unit is movable along the first guide assembly. A driver is configured to move the first gripping unit in a first direction. The driver is configured to move the second gripping unit in a second direction opposite to the first direction. The first gripping unit includes a first finger unit and a second finger unit independently moveable with respect to the first finger unit. The second gripping unit is spaced apart from the first gripping unit. The second gripping unit includes a third finger unit and a fourth finger unit independently moveable with respect to the third finger unit.

According to an exemplary embodiment of the present inventive concept, a gripper includes a first guide assembly. A first gripping unit is movable along the first guide assembly. A second gripping unit is movable along the first guide assembly. The first gripping unit includes a second guide assembly coupled with the first guide assembly. The first gripping unit includes a first finger unit movable in a first direction toward the first guide assembly or in a second direction opposite to the first direction along the second guide assembly. The first gripping unit includes a second finger unit movable in the first direction or in the second direction along the second guide assembly independently of the first finger unit. The second gripping unit includes a third guide assembly coupled with the first guide assembly. The second gripping unit includes a third finger unit movable in the first direction or in the second direction along the third guide assembly. The second gripping unit includes a fourth finger unit movable in the first direction or in the second direction along the third guide assembly independently of the third finger unit.

According to an exemplary embodiment of the present inventive concept, a gripper includes a body frame mounted on a magazine transfer robot. A first guide assembly is mounted on the body frame. A first gripping unit is movable along the first guide assembly. A second gripping unit is movable along the first guide assembly. A driver is configured to move the first gripping unit in a first direction. The driver is configured to move the second gripping unit in a second direction opposite to the first direction. A sensing unit is disposed on a region of an upper end of the body frame. The first gripping unit includes a first finger unit and a second finger unit independently moveable with respect to the first finger unit. The second gripping unit includes a third finger unit and a fourth finger unit independently moveable with respect to the third finger unit. The sensing unit includes a QR (Quick Response) code reader configured to recognize a QR code attached to facility. A plurality of laser displacement sensors are configured to recognize a distance to the facility.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
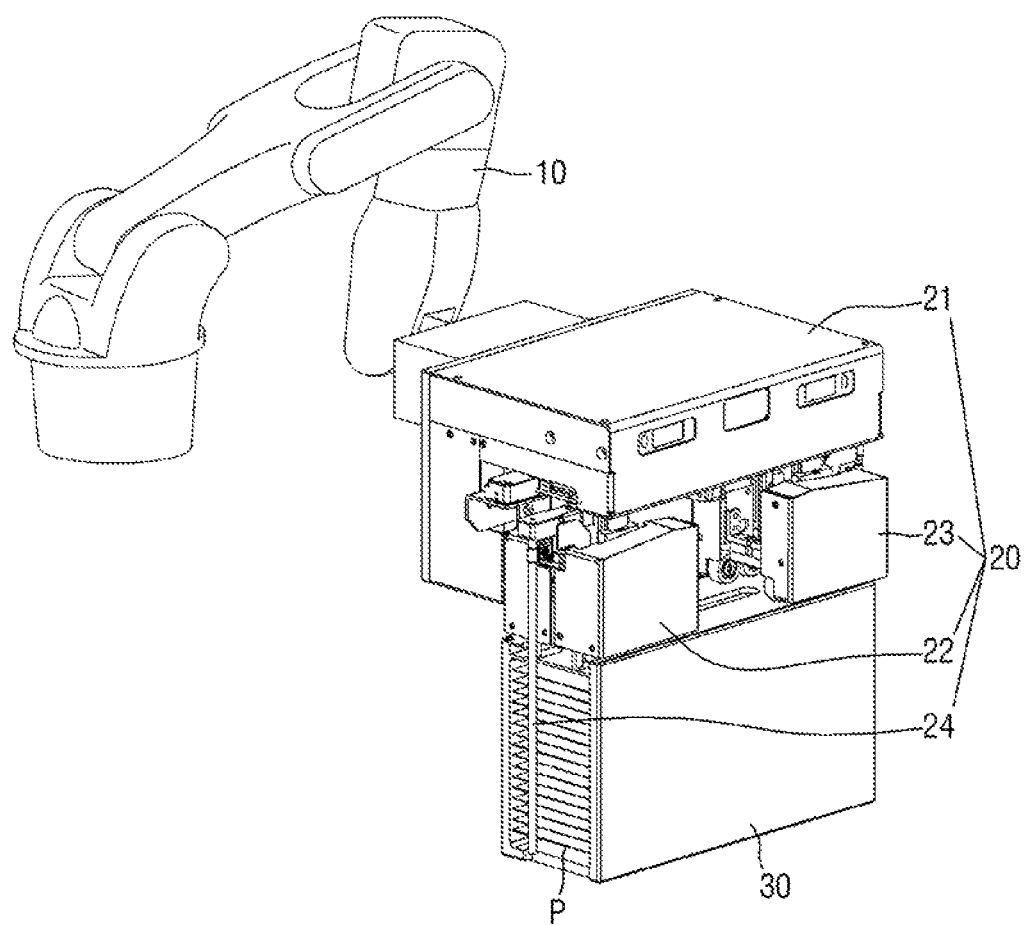
FIG. 1 illustrates a magazine transfer robot including a gripper according to an exemplary embodiment of the present inventive concept.
Figure 2:
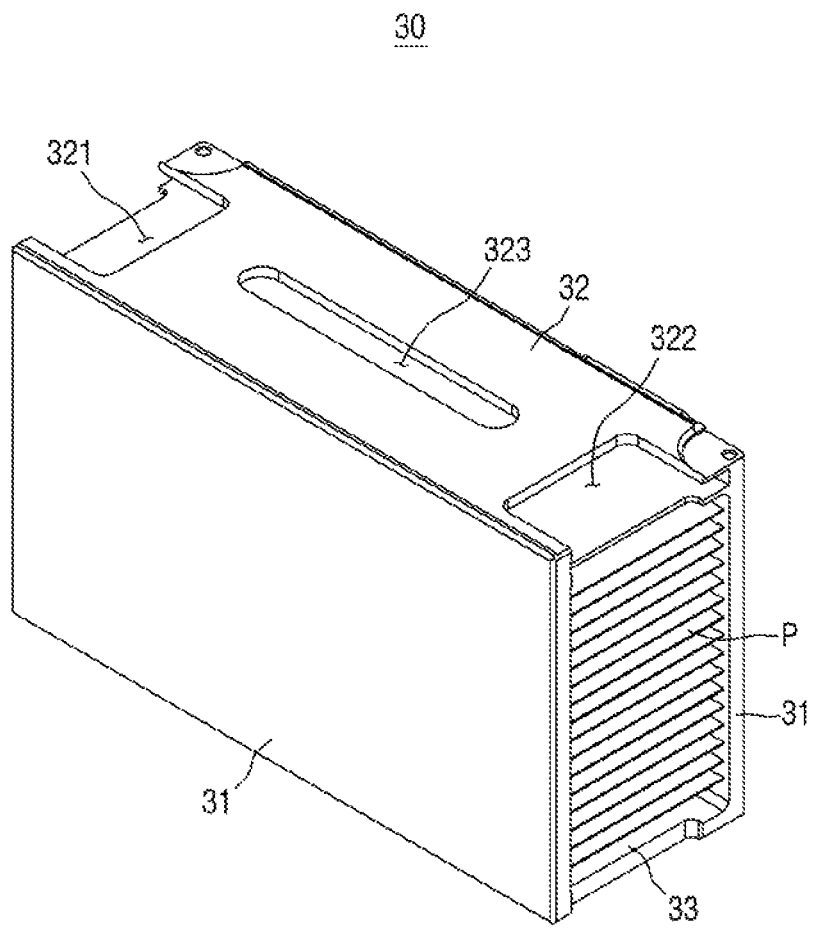
FIG. 2 illustrates a magazine to be moved by a gripper according to an exemplary embodiment of the present inventive concept.

FIG. 1 illustrates a magazine transfer robot including a gripper according to an exemplary embodiment of the present inventive concept. FIG. 2 illustrates a magazine to be moved by a gripper according to an exemplary embodiment of the present inventive concept.

Referring to FIG. 1, a magazine transfer robot 1 may include an arm 10 and a gripper 20. However, the magazine transfer robot 1 is not particularly limited to the exemplary embodiments described herein. For example, additional elements may be added or some of the elements described herein may be omitted from the magazine transfer robot 1.

The gripper 20 may include a body frame 21, a first gripping unit 22, a second gripping unit 23, and holding bars 24.

The arm 10 may have a six-axis vertical articulated structure. Thus, the arm 10 may be configured to move in at least six directions (e.g., forward and backward, up and down, and side to side). For example, the arm 10 may be a structure that operates with six joints having six rotation axes. However, exemplary embodiments of the present inventive concept are not limited thereto. For example, the arm 10 of the magazine transfer robot may be configured to move differently, as desired. As an example, the arm 10 may have various structures that can transfer a magazine 30.

The body frame 21 of the gripper 20 may be mounted to the arm 10. For example, the body frame 21 of the gripper 20 may be mounted on the front end of the arm 10. Alternatively, the body frame 21 of the gripper 20 may be mounted on a side, upper, or lower surfaces of the arm 10.

A variety of components may be included in the body frame 21 of the gripper 20. The components may be protected by the body frame 21.

The body frame 21 may include components such as a bracket, a support block, a plate, a housing, a cover, or a collar, which may support various components of the gripper 20. As an example, the components supporting various components of the gripper 20 may be collectively referred to herein as the body frame 21 of the gripper 20.

The first gripping unit 22 and the second gripping unit 23 may be spaced apart from each other. For example, the first gripping unit 22 and the second gripping unit 23 may be spaced apart from each other along a lengthwise direction of the magazine 30. The magazine 30 may have a rectangular shape having a relatively longer lengthwise portion and a relatively shorter widthwise portion that is perpendicular to the lengthwise portion. The magazine 30 may also have a vertical dimension that is longer than a length of the widthwise portion of the magazine 30.

The gripper 20 can grasp a top plate of the magazine 30 in which a plurality of printed circuit boards P is loaded to move the magazine 30. As an example, the gripper 20 can grasp the top plate of the magazine 30 even if the magazine 30 stands at a position deviated from a position (e.g., in a facility, such as a manufacturing facility). For example, the gripper 20 (e.g., and the magazine 30) may be tilted in the vertical dimension (e.g., a Z axis direction), along the longwise direction (e.g., an X axis direction) or along the widthwise direction (e.g., a Y axis direction). Alternatively, the magazine may be in a desired position along the vertical dimension (e.g., may be substantially level in the lengthwise dimension) but might not be in a desired orientation along the widthwise portion and/or along the lengthwise portion. Thus, as described herein, the gripper 20 according to an exemplary embodiment of the present inventive concept can grip a magazine 30 even when the magazine is displaced from a desired position. For example, any combination of displacements of the magazine 30 in the X, Y or Z axis direction may be compensated for by the gripper 20 being tilted according to an exemplary embodiment of the present inventive concept. Thus, a disruption in production operations may be reduced or eliminated and manufacturing costs may be reduced and manufacturing yield and efficiency may be increased.

Referring to FIG. 2, a plurality of printed circuit boards P may be loaded in the magazine 30 grasped by the gripper 20 (see, e.g., FIG. 1). However, exemplary embodiments of the present inventive concept are not limited thereto. For example, a wafer may be loaded in the magazine 30 instead of the printed circuit boards P.

The magazine 30 may have a pair of side plates 31 that stand vertically and are spaced apart from each other in parallel.

A plurality of loading slots may be provided on inner faces of the pair of side plates 31 facing each other, each having a length in the horizontal direction (e.g., the X axis direction) and spaced apart from one another at regular intervals in the vertical direction (e.g., the Z axis direction). Accordingly, the plurality of printed circuit boards P inserted into the magazine 30 may be arranged spaced apart from one another at substantially regular intervals.

The upper ends of the pair of side plates 31 may be connected by a top plate 32. The lower ends of the pair of side plates 31 may be connected by a bottom plate 33.

The front side and the rear side between the pair of side plates 31 may be at least partially opened. The plurality of printed circuit boards P may be inserted into the magazine 30 through the open front side or the open rear side.

The top plate 32 may include a first opening 321 formed at one side, a second opening 322 formed at the opposed side, and a hole 323 formed in a region of the top plate 32.

Referring FIG. 1, the gripper 20 may insert first and second fingers included in the first gripping unit 22 into the first opening 321 (see, e.g., FIG. 2) formed in the top plate 32 (see, e.g., FIG. 2) of the magazine 30. The gripper 20 may insert third and fourth fingers included in the second gripping unit 23 into the second opening 322 formed in the top plate 32 (see, e.g., FIG. 2) of the magazine 30. The first, second, third and fourth fingers may be inserted at substantially a same time as each other. Alternatively, one or more of the first, second, third and fourth fingers may be inserted at a different time from the other fingers. For example, the gripper 20 can grasp the top plate of the magazine 30 by inserting the first to fourth fingers into the first opening 321 and the second opening 322 (see, e.g., FIG. 2).

The front side and the rear side of the magazine 30 may be open, and thus the plurality of printed circuit boards P loaded in the magazine 30 may be dropped out of the magazine 30 while it is moved. Thus, the gripper 20 may include a pair of holding bars 24, which may prevent the plurality of printed circuit boards P from escaping from the magazine 30. Additionally, the arm 10 and the body frame 21 may operate to prevent the magazine 30 from being tilted to an extent that the printed circuit boards P are able to escape the magazine 30. Thus, the magazine transfer robot 1 according to an exemplary embodiment of the present inventive concept may operate without the use of the holding bars 24, and thus the holding bars 24 may be omitted. Thus, a disruption in production operations may be reduced or eliminated and manufacturing costs may be reduced, and manufacturing yield and efficiency may be increased.

Figure 3:
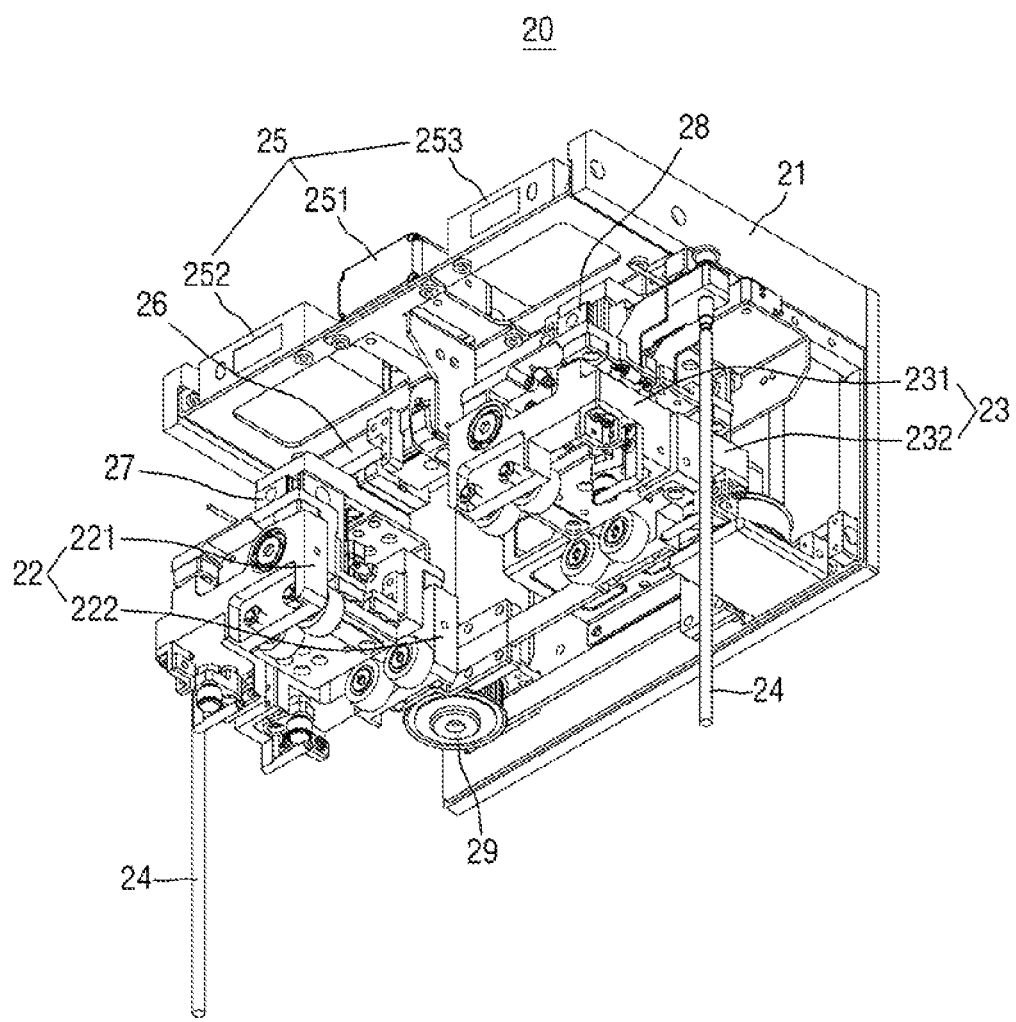
FIG. 3 illustrates an internal structure of a gripper according to an exemplary embodiment of the present inventive concept.
Figure 4:
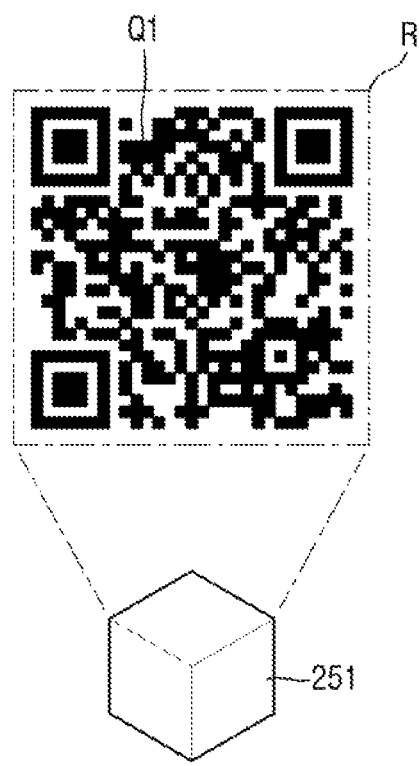
FIGS. 4 and 5 each illustrate a QR code and a QR code reader included in a gripper according to an exemplary embodiment of the present inventive concept.
Figure 5:
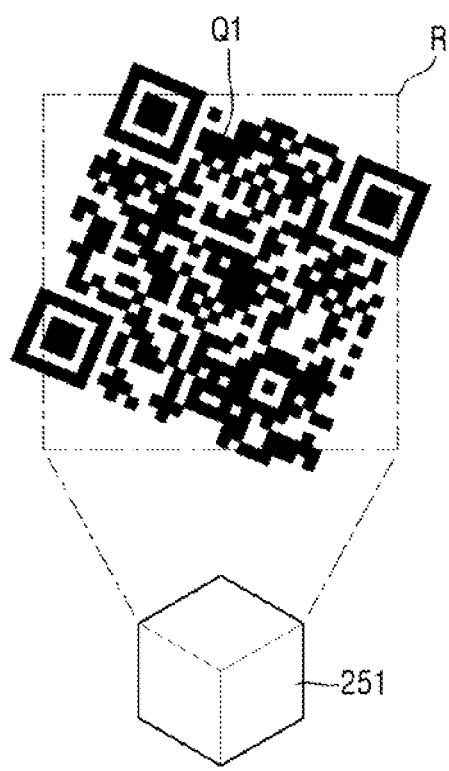
Figure 6:
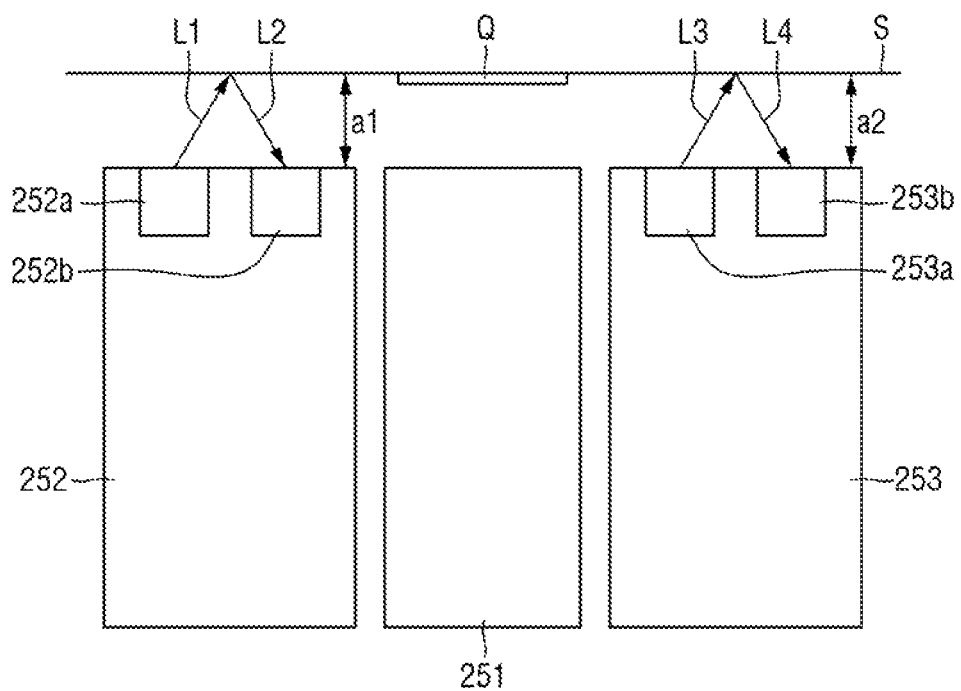
FIG. 6 illustrates laser displacement sensors included in a gripper according to an exemplary embodiment of the present inventive concept.
Figure 7:
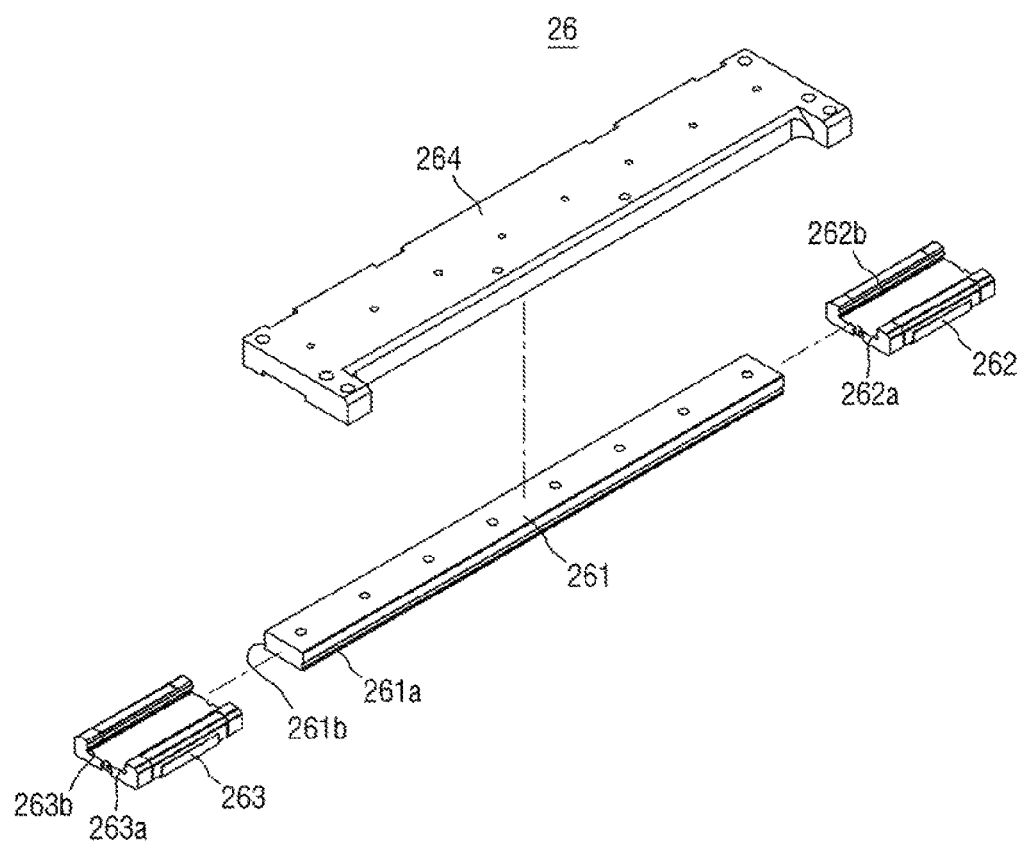
FIG. 7 is an exploded view of a first guide assembly included in a gripper according to an exemplary embodiment of the present inventive concept.
Figure 8:
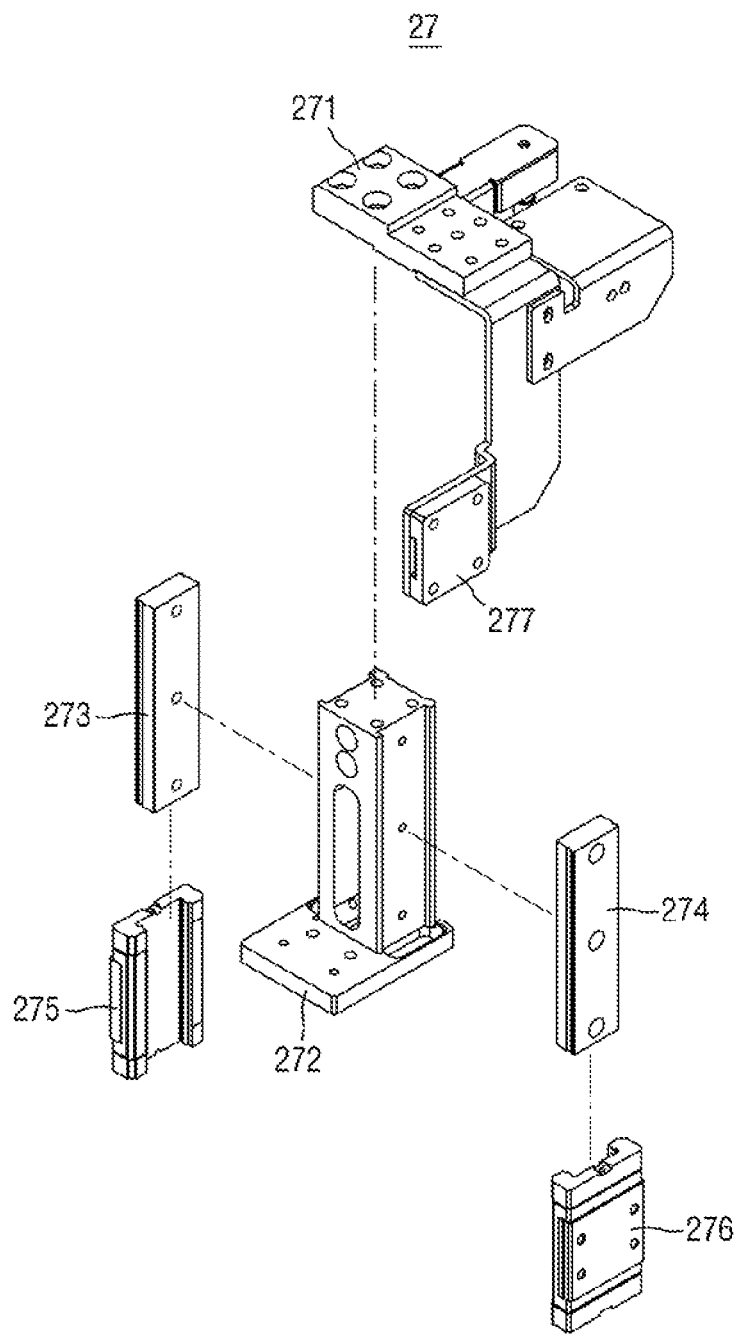
FIG. 8 is an exploded view of a second guide assembly included in a gripper according to an exemplary embodiment of the present inventive concept.
Figure 9:
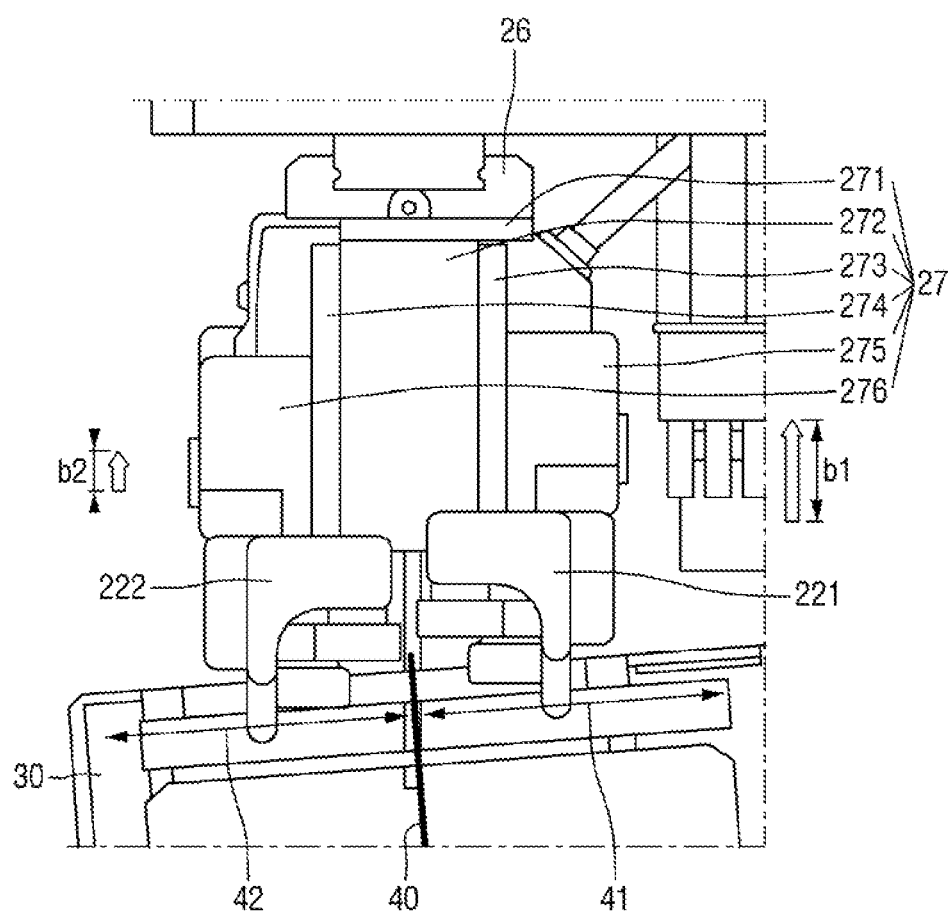
FIG. 9 illustrates a first finger unit and a second finger unit included in a gripper according to an exemplary embodiment of the present inventive concept.
Figure 10:
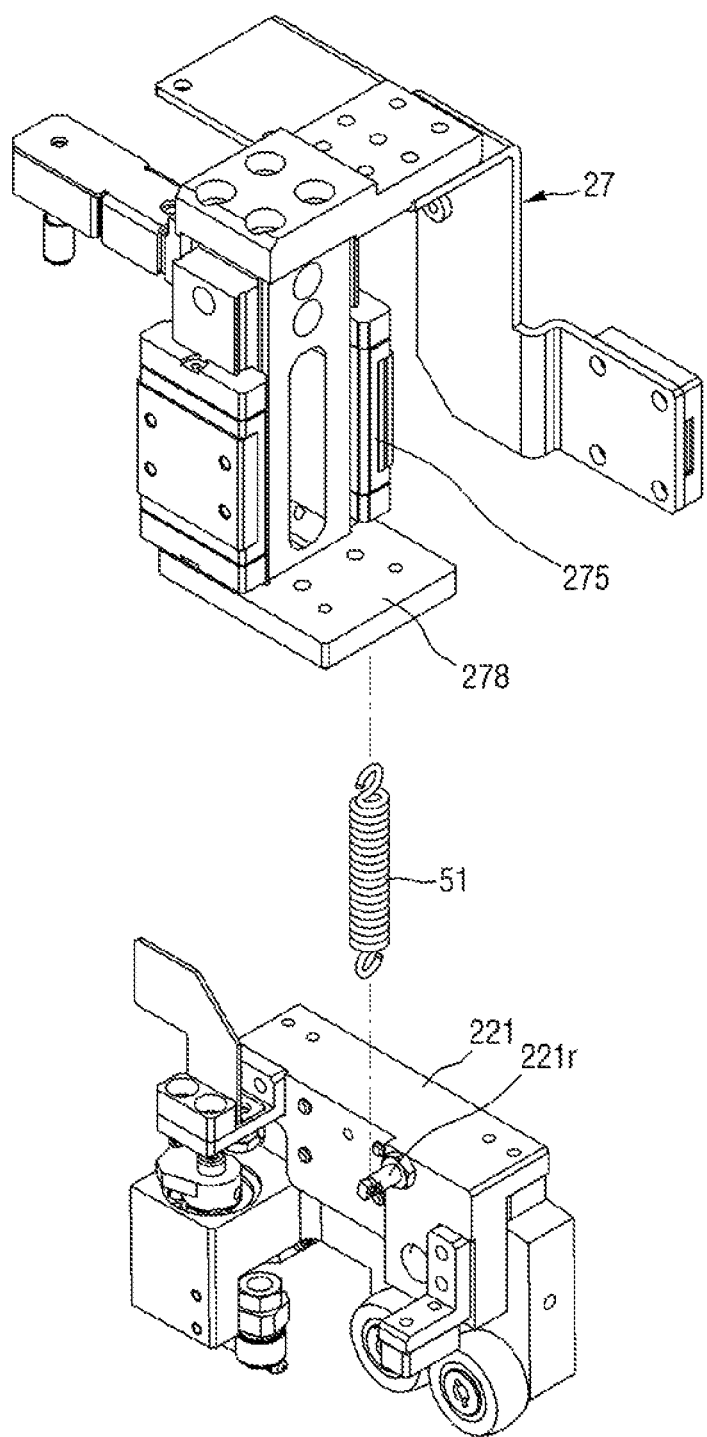
FIG. 10 is an exploded view of a first tension spring included in a gripper according to an exemplary embodiment of the present inventive concept.
Figure 11:
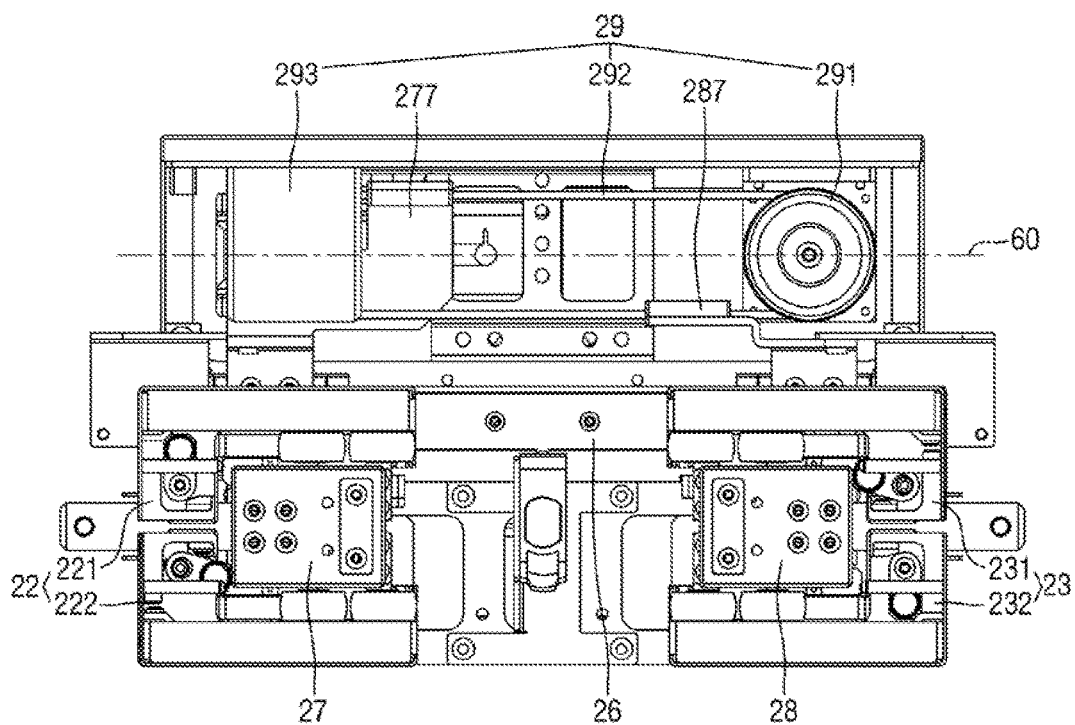
FIG. 11 illustrates a first gripping unit, a second gripping unit and a driver included in a gripper according to an exemplary embodiment of the present inventive concept.
Figure 12:
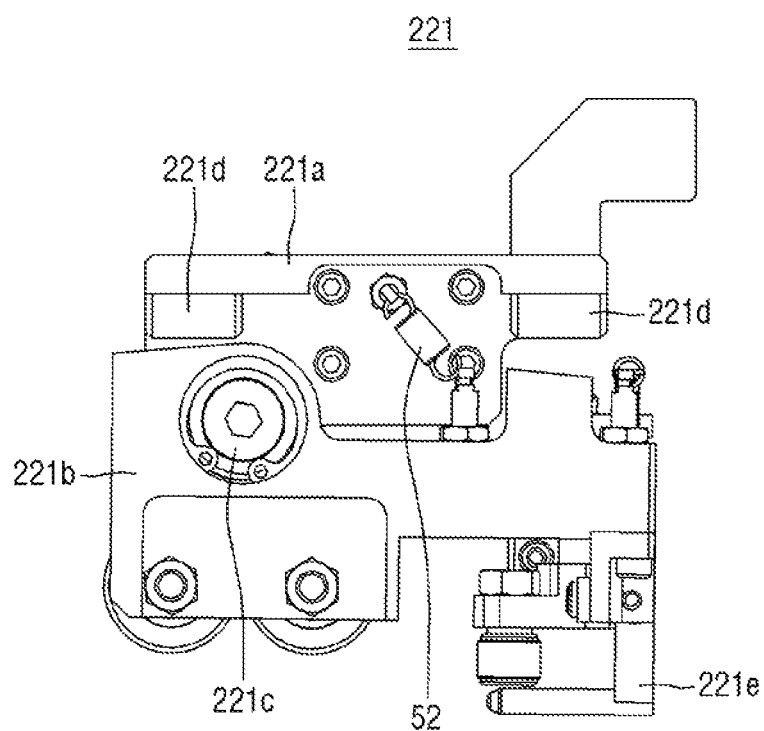
FIG. 12 illustrates a finger unit included in a gripper according to an exemplary embodiment of the present inventive concept.

FIG. 3 illustrates an internal structure of a gripper according to an exemplary embodiment of the present inventive concept. FIGS. 4 and 5 each illustrate a QR code and a QR code reader included in a gripper according to an exemplary embodiment of the present inventive concept. FIG. 6 illustrates laser displacement sensors included in a gripper according to an exemplary embodiment of the present inventive concept. FIG. 7 is an exploded view of a first guide assembly included in a gripper according to an exemplary embodiment of the present inventive concept. FIG. 8 is an exploded view of a second guide assembly included in a gripper according to an exemplary embodiment of the present inventive concept. FIG. 9 illustrates a first finger unit and a second finger unit included in a gripper according to an exemplary embodiment of the present inventive concept. FIG. 10 is an exploded view of a first tension spring included in a gripper according to an exemplary embodiment of the present inventive concept. FIG. 11 illustrates a first gripping unit, a second gripping unit and a driver included in a gripper according to an exemplary embodiment of the present inventive concept. FIG. 12 illustrates a finger unit included in a gripper according to an exemplary embodiment of the present inventive concept.

Referring to FIG. 3, the gripper 20 may include the body frame 21, the first gripping unit 22, the second gripping unit 23, the holding bars 24, a sensing unit 25, a first guide assembly 26, a second guide assembly 27, a third guide assembly 28, and a driver 29. However, exemplary embodiments of the present inventive concept are not limited thereto. For example, additional elements may be added to the gripper 20 or some of the described elements may be omitted.

The body frame 21 may be mounted on the magazine transfer robot 1 (e.g., on the front end of the arm of the magazine transfer robot 1). The body frame 21 may support the components inside the gripper 20.

The sensing unit 25 may be provided in a region of the upper end of the body frame 21.

The sensing unit 25 may include a QR (Quick Response) code reader 251 and a plurality of laser displacement sensors 252 and 253.

The QR code reader 251 may sense if the magazine 30 to be transferred is inclined with respect to a ground surface. For example, a surface on which the magazine 30 is to be picked up from may be tilted, or the magazine 30 may be displaced from a desired position. Alternatively, a surface onto which the magazine 30 is to be transferred may be inclined from a desired position, and thus, the angle of the magazine 30 may be adjusted, as described herein.

Referring to FIG. 4, when the facility is not inclined on the ground surface, a QR code Q1 provided on one face of the facility might not be inclined. Accordingly, the QR code Q1 may be located in a region R sensed by the QR code reader 251. If the QR code reader 251 recognizes that the QR code Q1 is located within the region R, it may be determined that the facility is not inclined on the ground surface. If the magazine transfer robot 1 recognizes that the facility is not inclined on the ground surface, it may keep the tilt of the gripper 20 unchanged.

Referring to FIG. 5, when the facility is inclined on the ground surface, a part of a QR code Q1 may exist outside the region R sensed by the QR code reader 251. If the QR code reader 251 recognizes that a part of the QR code Q1 comes out of the region R, it may be determined that the facility is inclined with respect to the ground surface.

If the magazine transfer robot 1 senses that a part of the QR code Q1 comes out of the region R by the QR code reader 251, it may rotate the gripper 20 clockwise (e.g., or counterclockwise) until the QR code Q1 is completely located within the region R.

After the gripper 20 is rotated so that the QR code Q1 is completely located within the region R, the tilt of the rotated gripper 20 with respect to the ground surface may be equal to the inclination of the facility with respect to the ground surface. Accordingly, the gripper 20 may have a tilt appropriate for grasping the top plate of the magazine. For example, the gripper 20 (e.g., and the magazine 30) may be tilted in the vertical dimension (e.g., a Z axis direction), along the longwise direction (e.g., an X axis direction) or along the widthwise direction (e.g., a Y axis direction). Alternatively, the magazine may be in a desired position along the vertical dimension (e.g., may be substantially level in the lengthwise dimension) but might not be in a desired orientation along the widthwise portion and/or along the lengthwise portion. Thus, as described herein, the gripper 20 according to an exemplary embodiment of the present inventive concept can grip a magazine 30 even when the magazine is displaced from a desired position. For example, any combination of displacements of the magazine 30 in the X, Y or Z axis direction may be compensated for by the gripper 20 being tilted according to an exemplary embodiment of the present inventive concept. Thus, a disruption in production operations may be reduced or eliminated and manufacturing costs may be reduced and manufacturing yield and efficiency may be increased.

Referring to FIG. 6, to hold the top plate of the magazine, the plurality of laser displacement sensors 252 and 253 may sense if the body frame of the gripper 20 is spaced apart from a first surface S of the equipment, e.g., the surface where the QR codes Q is provided by a predetermined distance. As an example, two laser displacement sensors will be described herein. However, exemplary embodiments of the present inventive concept are not limited thereto, and more than two laser displacement sensors may be employed.

The first laser displacement sensor 252 and the second laser displacement sensor 253 may be disposed on opposite sides of the QR code reader 251, respectively.

The first laser displacement sensor 252 may include a light-emitting portion 252a and a light-receiving portion 252b. The second laser displacement sensor 253 may include a light-emitting portion 253a and a light-receiving portion 253b.

The first laser displacement sensor 252 may emit first incident light L1 onto the first surface S of the facility by the light-emitting portion 252a. The first laser displacement sensor 252 may sense first reflected light L2 corresponding to the first incident light L1 reflected off the first surface S by the light-receiving portion 252b. The first laser displacement sensor 252 may determine a first distance a1 between the first laser displacement sensor 252 and the first surface S using the time when the first incident light L1 is incident and the time when the second reflected light L2 is sensed.

The second laser displacement sensor 253 may emit second incident light L3 onto the first surface S of the facility by the light-emitting portion 253a. The second laser displacement sensor 253 may sense second reflected light L4 corresponding to the second incident light L3 reflected off the first surface S by the light-receiving portion 253b. The second laser displacement sensor 253 may determine a second distance a2 between the second laser displacement sensor 253 and the first surface S using the time when the second incident light L3 is incident and the time when the second reflected light L4 is sensed.

The magazine transfer robot 1 may adjust the position of the gripper 20 so that the first distance a1 and the second distance a2 each correspond to a predetermined distance. The predetermined distance may refer to a distance suitable for grasping the top plate of the magazine 30 by using the gripper 20.

Referring back to FIG. 3, the first guide assembly 26 may be mounted on the body frame 21. The first guide assembly 26 may be mounted on a bottom and/or a side surface of the body frame 21, and the first guide assembly 26 may extend along the X axis direction of the body frame 21. Each of the first gripping unit 22 and the second gripping unit 23 may be movable along the first guide assembly 26. For example, the first gripping unit 22 and the second gripping unit 23 may be movable along the X axis direction and/or along the Y axis direction on the first guide assembly 26.

Referring to FIG. 7, the first guide assembly 26 may include a first pillar 261, a first moving block 262, a second moving block 263, and a first fastening part 264. However, exemplary embodiments of the present inventive concept are not limited thereto and additional elements may be added or some of the described elements may be omitted.

The first fastening part 264 may fasten the first pillar 261 to the body frame 21 (see, e.g., FIG. 3).

The first pillar 261 may include a first guide groove 261a and a second guide groove 261b for guiding the movement of the first moving block 262 (e.g., in the X axis direction along an extending direction of the first guide assembly 26).

The first guide groove 261a may be formed on a first longer side of the first pillar 261, and the second guide groove 261b may be formed on a second longer side opposite to the first longer side.

The first moving block 262 may at least partially cover the first longer side, the second longer side and the bottom of the first pillar 261.

The first moving block 262 may have a first protrusion 262a on a first inner side thereof. The first inner side may correspond to the first longer side of the first pillar 261.

The first moving block 262 may have a second protrusion 262b on a second inner side thereof. The second inner side may correspond to the second longer side of the first pillar 261.

The first protrusion 262a may be inserted into the first guide groove 261a, and the second protrusion 262b may be inserted into the second guide groove 261b.

As the first protrusion 262a and the second protrusion 262b may be inserted into the first guide groove 261a and the second guide groove 261b, respectively, the first moving block 262 may move along the first pillar 261.

The second moving block 263 may at least partially cover the first longer side, the second longer side and the bottom of the first pillar 261.

The second moving block 263 may have a third protrusion 263a on a third inner side thereof. The third inner side may correspond to the first longer side of the first pillar 261.

The second moving block 263 may have a fourth protrusion 263b on a fourth inner side thereof. The fourth inner side may correspond to the second longer side of the first pillar 261.

The third protrusion 263a may be inserted into the first guide groove 261a, and the fourth protrusion 263b may be inserted into the second guide groove 261b.

As the third protrusion 263a and the fourth protrusion 263b are inserted into the first guide groove 261a and the second guide groove 261b, respectively, the second moving block 263 may move along the first pillar 261.

Lubricant may be applied on the first longer side of the first pillar 261, the second longer side of the first pillar 261, the bottom of the first pillar 261, the inner sides of the first moving block 262, and the inner sides of the second moving block 263.

Referring back to FIG. 3, the second guide assembly 27 may be fastened to the first moving block 262 (see, e.g., FIG. 7) included in the first guide assembly 26. The first gripping unit 22 may be fastened to the second guide assembly 27. As the first moving block 262 (see, e.g., FIG. 7) horizontally moves along the first guide assembly 26 (e.g., along the X axis direction), the first gripping unit 22 may move horizontally along the first guide assembly 26.

In addition, the third guide assembly 28 may be fastened to the second moving block 263 (see, e.g., FIG. 7) included in the first guide assembly 26. The second gripping unit 23 may be fastened to the third guide assembly 28. As the second moving block 263 (see, e.g., FIG. 7) horizontally moves along the first guide assembly 26 (e.g., along the X axis direction), the second gripping unit 23 may move horizontally along the first guide assembly 26.

Referring to FIG. 8, the second guide assembly 27 may include a second fastening part 271, a second pillar 272, a first rail 273, a second rail 274, a third moving block 275, a fourth moving block 276, and a third fastening part 277. However, exemplary embodiments of the present inventive concept are not limited thereto and additional elements may be added or some of the described elements may be omitted.

The second pillar 272 may be coupled with (e.g., vertically coupled with) the first guide assembly 26 (see, e.g., FIG. 7) by the second fastening part 271.

The first rail 273 may be provided on the third longer side of the second pillar 272. The second rail 274 may be provided on the fourth longer side of the second pillar 272. The fourth longer side may be opposite the third longer side.

The third moving block 275 may at least partially cover the first rail 273. The third moving block 275 may move in the vertical direction (e.g., the Z axis direction) along the first rail 273. For example, the third moving block 275 is movable in a third direction toward the first pillar 261 (see, e.g., FIG. 7) or in a fourth direction opposite to the third direction (e.g., along the Z axis direction).

The fourth moving block 276 may at least partially cover the second rail 274. The fourth moving block 276 may move in the vertical direction along the second rail 274. For example, the fourth moving block 276 is movable in the third direction toward the first pillar 261 (see, e.g., FIG. 7) or in the fourth direction opposite to the third direction.

The third moving block 275 may move independently of the fourth moving block 276.

Lubricant may be applied on the first rail 273, the second rail 274, the inner sides of the third moving block 275, and the inner sides of the fourth moving block 276.

The third fastening part 277 may be connected to a belt included in a driver (e.g., driver 29. This will be described in more detail below with reference to FIG. 11.

The third guide assembly 28 (see, e.g., FIG. 3) may include a third pillar vertically coupled with the second moving block 263 (see, e.g., FIG. 7), a third rail provided on the fifth longer side of the third pillar, a fourth rail provided on the sixth longer side of the third pillar facing the fifth longer side, a fifth moving block covering the third rail and movable along the third rail, and a sixth moving block at least partially covering the fourth rail and movable along the fourth rail. The third guide assembly 28 (see, e.g., FIG. 3) may include a fourth fastening part for coupling (e.g., vertically coupling) the third pillar with the second moving block, and a fifth fastening part connected to the belt included in the driver. The configuration of the third guide assembly 28 (see, e.g., FIG. 3) is substantially the same as that of the second guide assembly 27 (see, e.g., FIG. 8); and, therefore, the components included in the third guide assembly 28 (see, e.g., FIG. 28) may be substantially the same as those described above for the second guide assembly 27. Thus, duplicative descriptions may be omitted herein.

Referring back to FIG. 3, the third moving block 275 (see, e.g., FIG. 8) included in the second guide assembly 27 may be coupled with a first finger unit 221. The fourth moving block 276 (see, e.g., FIG. 8) included in the second guide assembly 27 may be coupled with a second finger unit 222. Each of the first finger unit 221 and the second finger unit 222 may move in the third direction toward the first guide assembly 26 or in the fourth direction opposite to the third direction.

Similarly, the fifth moving block included in the third guide assembly 28 may be coupled with a third finger unit 231. The sixth moving block included in the third guide assembly 28 may be coupled with a fourth finger unit 232. Each of the third finger unit 231 and the fourth finger unit 232 may move in the third direction or in the fourth direction.

Referring to FIG. 9, the second guide assembly 27 may include the second fastening part 271, the second pillar 272, the first rail 273, the second rail 274, the third moving block 275, and the fourth moving block 276.

The second pillar 272 may be coupled with (e.g., may be vertically coupled with) the first guide assembly 26 by the second fastening part 271. The first rail 273 may be disposed on a side of the second pillar 272, and the second rail 274 may be disposed on another side (e.g., an opposite side) of the second pillar 272. The third moving block 275 at least partially covering the first rail 273 may move along the first rail 273 in the third direction toward the first pillar 261 or in the fourth direction opposite to the third direction. The fourth moving block 276 at least partially covering the second rail 274 may move along the second rail 274 in the third direction or the fourth direction. The third moving block 275 and the fourth moving block 276 are movable independently of each other, and accordingly the first finger unit 221 coupled to the third moving block 275 may move independently of the second finger unit 222 coupled with the fourth moving block 276.

The top plate of the magazine 30 may include a first region 41 corresponding to the first finger unit 221 and a second region 42 corresponding to the second finger unit 222 with a center line 40 therebetween.

Referring to FIG. 9, when the magazine 30 is inclined such that the first region 41 is higher than the second region 42, the distance by which each of the first finger unit 221 and the second finger unit 222 in direct contact with the top plate of the magazine 30 moves may become different.

For example, the first finger unit 221 in direct contact with the first region 41 may move by a first distance b1 in the third direction toward the first guide assembly 26. The second finger unit 222 in direct contact with the second region 42 may move along the second rail 274 by a second distance b2 that is less than the first distance b1 in the third direction. The first and second finger units 221 and 222 may be moved substantially simultaneously. Alternatively, the first and second finger units 221 and 222 may be moved at different times from each other.

For example, when the gripper 20 moves in the fourth direction away from the first guide assembly 26, a first force may be applied to the first finger unit 221 in the third direction when the first finger unit 221 comes into direct contact with the first region 41. Thus, the first finger unit 221 may be moved by the first distance b1 in the third direction as a result of the first force. The third moving block 275 may move in the third direction along the first rail 273 to guide the movement of the first finger unit 221. Thus, the first finger unit 221 may move a greater distance in the third direction (e.g., distance b1) than a distance that the second finger unit 222 moves in the third direction (e.g., distance b2).

As an example, when the gripper 20 moves in the fourth direction away from the first guide assembly 26, a second force may be applied to the second finger unit 222 in the third direction opposite to the fourth direction when the second finger unit 222 comes into direct contact with the second region 42. Then, the second finger unit 222 may be moved by the second distance b2 in the third direction as a result of the second force. The fourth moving block 276 may move in the third direction along the second rail 274 to guide the movement of the second finger unit 222.

The first force may be larger than the second force because the magazine 30 may be inclined such that the first region 41 is higher than the second region 42. Therefore, the first distance b1 may be greater than the second distance b2.

As described above in more detail, the first finger unit 221 and the second finger unit 222 are independently movable in the third direction or in the fourth direction opposite to the third direction, and thus the top plate of the magazine inclined (along the Y axis direction) can be grasped by the gripper 20.

Although the first finger unit 221 and the second finger unit 222 have been described (e.g., with reference to FIG. 9), the third finger unit 231 and the fourth finger unit 232 (see, e.g., FIG. 3) may have substantially the same configuration as that of the first finger unit 221 and the second finger unit 222. Thus, the third finger unit 231 and the fourth finger unit 232 may operate in substantially the same manner as first finger unit 221 and the second finger unit 222. Thus, duplicative descriptions may be omitted herein.

Referring to FIG. 10, the first finger unit 221 may be coupled to the third moving block 275 included in the second guide assembly 27. The second guide assembly 27 may include an extended surface 278 extending from its bottom surface in a horizontal direction (e.g., in the X axis direction.

One end of a first tension spring 51 may be connected to a region on the extended surface 278. A spring holding hook 221r may be provided on a side surface of the first finger unit 221 coupled with the third moving block 275. The other end of the first tension spring 51 may be connected to the spring holding hook 221r. For example, the first tension spring 51 may be connected between the first finger unit 221 and the second guide assembly 27.

When the first finger unit 221 is moved in the third direction toward the first guide assembly 26, the first tension spring 51 may apply a force to the first finger unit 221 in the fourth direction opposite to the third direction.

Therefore, when the first finger unit 221 is moved in the third direction by a predetermined distance (for example, 10 mm), the movement of the first finger unit 221 in the third direction may be restricted by the force applied by the first tension spring 51.

A tension spring may also be connected between the second finger unit 222 and the second guide assembly 27 in the same manner as that of the first finger unit 221. Thus, duplicative descriptions may be omitted herein. Further, a tension spring may also be connected between the third finger unit 231 (see, e.g., FIG. 3) and the third guide assembly 28 and between the fourth finger unit 232 (see, e.g., FIG. 3) and the third guide assembly 28. Such tension springs are similar with the tension spring 51 described above with reference to FIG. 10; and, therefore, duplicative descriptions may be omitted herein.

Referring back to FIG. 3, the driver 29 may be coupled to the body frame 21. The driver 29 may move the first gripping unit 22 in the first direction and may move the second gripping unit 23 in the second direction opposite to the first direction (e.g., along the X axis). Additionally, the driver 29 may move the first gripping unit 22 and the second gripping unit 23 along the Y axis. For example, the first and second finger units 221 and 222 may move in the same direction as each other along the Y axis or in opposite directions from each other along the Y axis. Similarly, the third and fourth figure units 231 and 232 may move in the same direction as each other along the Y axis or in opposite directions from each other along the Y axis.

Referring to FIG. 11, the driver 29 may include a guide roller 291, a belt 292, and a driving motor 293.

The third fastening part 277 included in the second guide assembly 27 may be fastened to a part of the belt 292 located above a first reference line 60 passing through the center axis of the guide roller 291 and the center axis of the driving motor 293. The fifth fastening part 287 included in the third guide assembly 28 may be fastened to a part of the belt 292 located below the first reference line 60.

The belt 292 may move clockwise along the guide roller 291 as the driving motor 293 is rotated clockwise. In this case, the third fastening part 277 may move in the first direction toward the guide roller 291, and the fifth fastening part 287 may move in the second direction opposite to the first direction. As a result, the first gripping unit 22 and the second gripping unit 23 may substantially simultaneously move such that they become closer to each other.

On the other hand, the belt 292 may move counterclockwise along the guide roller 291 as the driving motor 293 is rotated counterclockwise. In this case, the third fastening part 277 may move in the second direction toward the driving motor 293, and the fifth fastening part 287 may move in the first direction opposite to the second direction. In addition, the first gripping unit 22 and the second gripping unit 23 may substantially simultaneously move such that they become farther from each other.

Referring back to FIG. 3, the first gripping unit 22 may include the first finger unit 221 and the second finger unit 222, each of which is vertically movable and rotatable independently of each other. The second gripping unit 23 may include the third finger unit 231 and the fourth finger unit 232, each of which is vertically movable and rotatable independently of each other.

The rotation of the first finger unit 221, the second finger unit 222, the third finger unit 231 and the fourth finger unit 232 will be described in more detail below with reference to FIG. 12.

Referring to FIG. 12, the first finger unit 221 may include a first fixed part 221a, a first rotating part 221b, a first rotation shaft 221c, a first stopper 221d, and a first finger 221e. However, exemplary embodiments of the present inventive concept are not limited thereto and additional elements may be added or some of the described elements may be omitted.

The first fixed part 221a may be fixedly coupled with the second guide assembly 27 (see, e.g., FIG. 8). For example, the first fixed part 221a may be fixedly coupled with the third moving block 275 (see, e.g., FIG. 8) included in the second guide assembly 27 (see, e.g., FIG. 8).

The first rotating part 221b may be rotationally coupled with the first fixed part 221a through the first rotation shaft 221c.

The first rotating part 221b may rotate clockwise or counterclockwise about a first rotation axis (e.g., an axis extending along an extending direction (e.g., extending along the Y axis) of the first rotation shaft 221c).

A region of the first rotating part 221b and a region of the first fixed part 221a may be connected to each other by the second tension spring 52. Therefore, it is possible to avoid the portion of the first rotating part 221b where the first finger 221e is located from moving downward beyond a predetermined position.

The first fixed part 221a may include a first stopper 221d that restricts the first rotating part 221b from rotating beyond a predetermined angle. Therefore, the first rotating part 221b may be restricted from rotating beyond a predetermined angle (for example, 5 degrees) clockwise or counterclockwise.

One end of the first finger 221e may be coupled to one end of the lower side of the first rotating part 221b. The first finger 221e may be bent at an angle (e.g., a right angle) such that the other end of the first finger 221e faces the side where the third finger unit 231 (see, e.g., FIG. 3) is disposed. However, exemplary embodiments of the present inventive concept are not limited thereto. For example, the first finger 221e may have different shapes.

The other end of the first finger 221e may be inserted into the first opening 321 (see, e.g., FIG. 2) formed on one side of the top plate 32 (see, e.g., FIG. 2) of the magazine 30.

The second finger unit 222 (see, e.g., FIG. 3), the third finger unit 231 (see, e.g., FIG. 3) and the fourth finger unit 232 (see, e.g., FIG. 3) may include substantially the same elements as those of the first finger unit 221, and thus duplicative descriptions may be omitted herein.

For example, the second finger unit 222 (see, e.g., FIG. 3) may include a second fixed part fixedly coupled with the second guide assembly 27 (see, e.g., FIG. 3), a second rotating part rotatably coupled with the second fixed part so that it can rotate about a second rotation shaft in parallel with the first guide assembly 26 (see, e.g., FIG. 3), a second stopper restricting the second rotating part from rotating beyond a predetermined angle, and a second finger inserted into the first opening 321 (see, e.g., FIG. 2) provided on one side of the top plate 32 of the magazine 30. The third finger unit 231 (see, e.g., FIG. 3) may include a third fixed part fixedly coupled with the third guide assembly 28 (see, e.g., FIG. 3), a third rotating part rotatably coupled with the third fixed part so that it can rotate about a third rotation shaft in parallel with the first guide assembly 26 (see, e.g., FIG. 3), a third stopper restricting the third rotating part from rotating beyond a predetermined angle, and a third finger inserted into the second opening 322 (see, e.g., FIG. 2) provided on the other side of the top plate 32 of the magazine 30. The fourth finger unit 232 (see, e.g., FIG. 3) may include a fourth fixed part fixedly coupled with the third guide assembly 28 (see, e.g., FIG. 3), a fourth rotating part rotatably coupled with the fourth fixed part so that it can rotate about a fourth rotation shaft in parallel with the first guide assembly 26 (see, e.g., FIG. 3), a fourth stopper restricting the fourth rotating part from rotating beyond a predetermined angle, and a fourth finger inserted into the second opening 322 (see, e.g., FIG. 2) provided on the other side of the top plate 32 of the magazine 30.

Referring back to FIG. 3, a pair of holding bars 24 for preventing the plurality of printed circuit boards P loaded in the magazine 30 (see, e.g., FIG. 2) from escaping from the magazine 30 may be provided on opposite sides of the gripper 20.

The gripper 20 may include a detecting unit for detecting if there is an error in the first finger unit 221, the second finger unit 222, the third finger unit 231 and the fourth finger unit 232. The detecting unit may detect if the first finger unit 221, the second finger unit 222, the third finger unit 231 and the fourth finger unit 232 move to overlap each other (e.g., along the Z axis), or to come into direct contact with each other.

Figure 13:
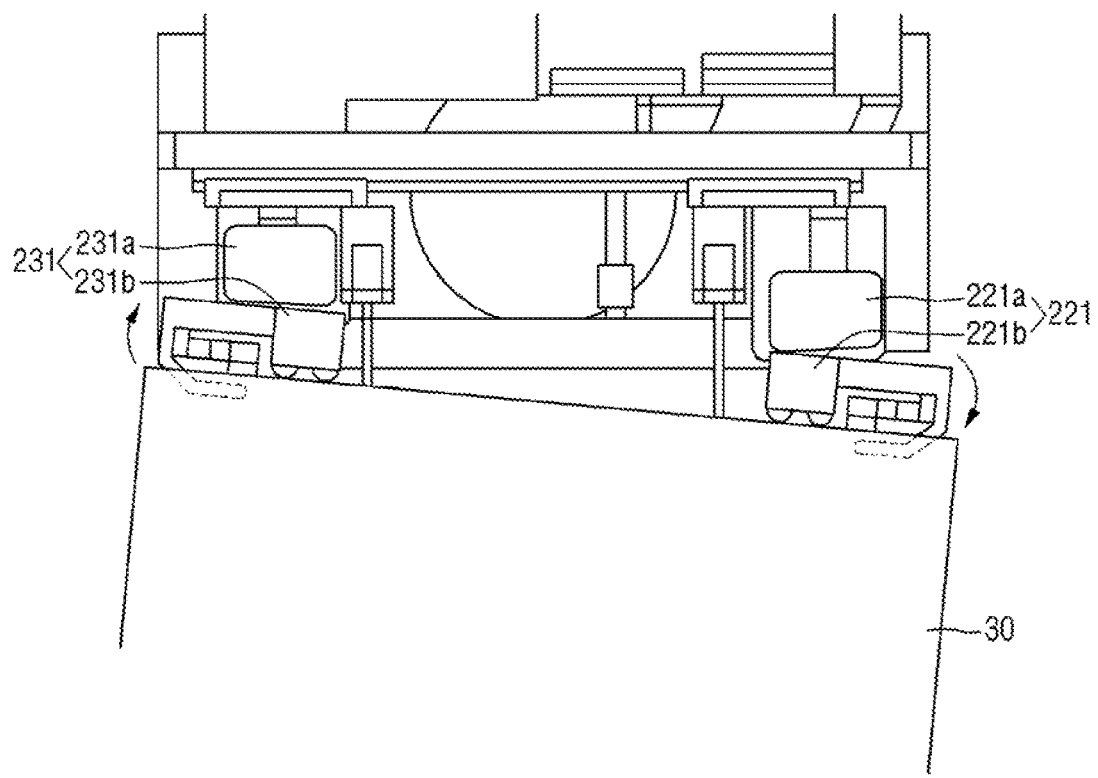
FIG. 13 illustrates a top plate of an inclined magazine and a gripper according to an exemplary embodiment of the present inventive concept.

FIG. 13 illustrates a top plate of an inclined magazine and a gripper according to an exemplary embodiment of the present inventive concept.

In the following description referring to FIG. 13, as an example, the magazine 30 in which a plurality of printed circuit boards is loaded is inclined such that the first opening 321 is lower than the second opening 322 (see, e.g., FIG. 2) of the magazine 30.

Referring to FIG. 13, when the gripper 20 moves vertically toward the magazine 30, the first finger unit 221 and the third finger unit 231 may come into direct contact with the top plate of the magazine 30. A first force may be applied to the first finger unit 221 in the fourth direction away from the magazine 30, while a second force, which is larger than the first force, may be applied to the third finger unit 231 in the fourth direction. Accordingly, the first finger unit 221 may move in the fourth direction by a first distance, while the third finger unit 231 may move in the fourth direction by a second distance larger than the first distance.

Since the first finger unit 221 and the third finger unit 231 can independently move in the vertical direction (e.g., along the Z axis), the distance that the first finger unit 221 moves may be different from the distance that the third finger unit 231 moves.

The first finger unit 221 may include the first fixed part 221a and the first rotating part 221b.

The first rotating part 221b may be rotatably coupled to the first fixed part 221a to rotate about the first rotation axis. Since the first opening 321 (see, e.g., FIG. 2) of the magazine 30 is positioned further downward than the second opening 322 (see, e.g., FIG. 2), the first rotating part 221b may rotate clockwise about the first rotation shaft.

On the other hand, the third finger unit 231 may include a third fixed part 231a and a third rotating part 231b. The third rotating part 231b may be rotatably coupled with the third fixed part 231a so that it rotates about the third rotation shaft. Since the second opening 322 (see, e.g., FIG. 2) of the magazine 30 is positioned further upward than the first opening 321 (see, e.g., FIG. 2), the third rotating part 231b may rotate clockwise about the third rotation shaft.

Although only the first finger unit 221 and the third finger unit 231 have been described (e.g., with reference to FIG. 13), the second finger unit 222 (see, e.g., FIG. 3) may move in the same manner as the first finger unit 221, and the fourth finger unit 232 (see, e.g., FIG. 3) may move in the same manner as the third finger unit 231. Thus, duplicative descriptions may be omitted herein.

Thus, the first finger unit 221, the second finger unit 222, the third finger unit 331 and the fourth finger unit 232 (see, e.g., FIG. 3) may each move vertically (e.g., along the Z axis) and may also rotate, and thus the top plate 32 of the inclined magazine 30 can be grasped by the gripper 20. For example, the gripper 20 (e.g., and the magazine 30) may be tilted in the vertical dimension (e.g., a Z axis direction), along the longwise direction (e.g., an X axis direction) or along the widthwise direction (e.g., a Y axis direction). Alternatively, the magazine may be in a desired position along the vertical dimension (e.g., may be substantially level in the lengthwise dimension) but might not be in a desired orientation along the widthwise portion and/or along the lengthwise portion. Thus, as described herein, the gripper 20 according to an exemplary embodiment of the present inventive concept can grip a magazine 30 even when the magazine is displaced from a desired position. For example, any combination of displacements of the magazine 30 in the X, Y or Z axis direction may be compensated for by the gripper 20 being tilted according to an exemplary embodiment of the present inventive concept. Thus, a disruption in production operations may be reduced or eliminated and manufacturing costs may be reduced and manufacturing yield and efficiency may be increased.

Figure 14:
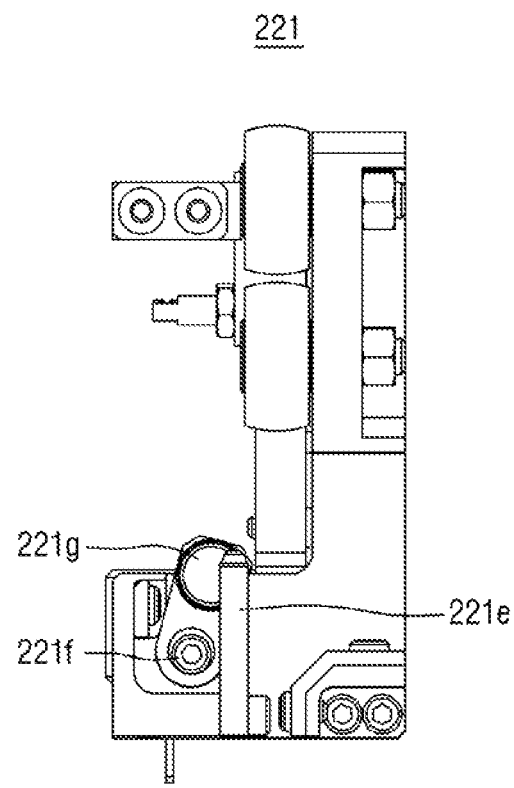
FIGS. 14 and 15 illustrate an aligning part included in a first finger unit of a gripper according to an exemplary embodiment of the present inventive concept.
Figure 15:
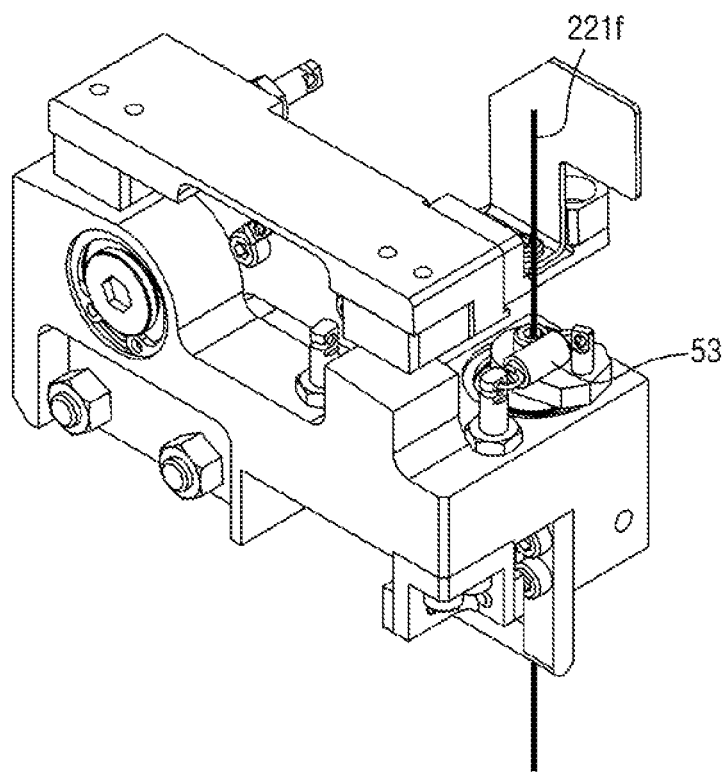
Figure 16:
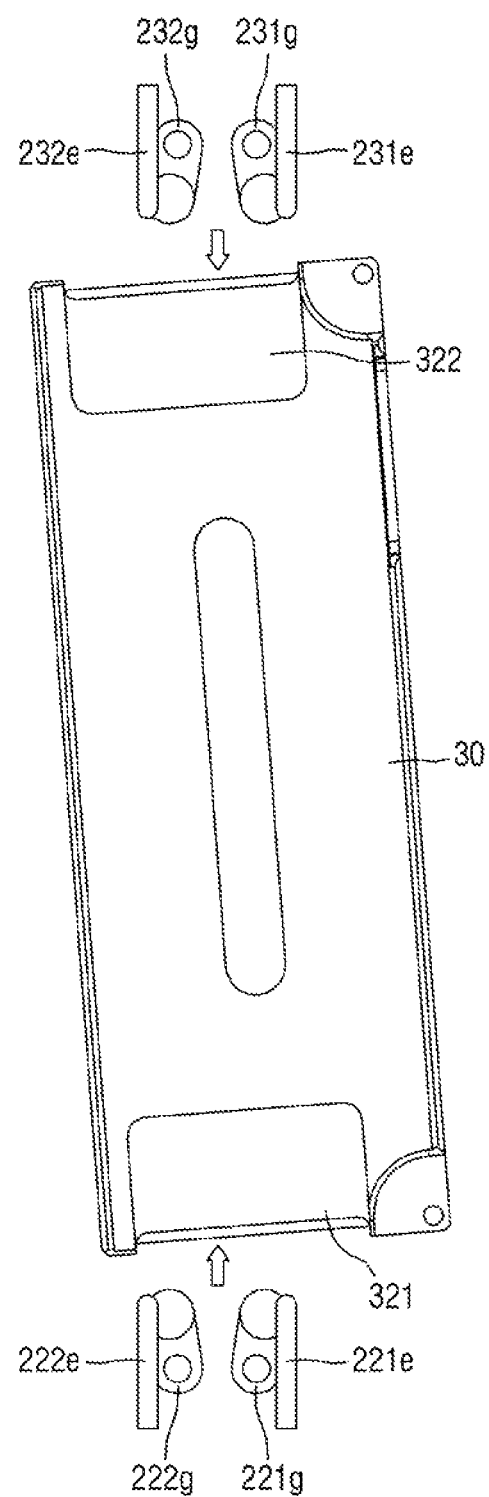
FIGS. 16 and 17 illustrate a magazine and aligning parts included in finger units of a gripper according to an exemplary embodiment of the present inventive concept.
Figure 17:
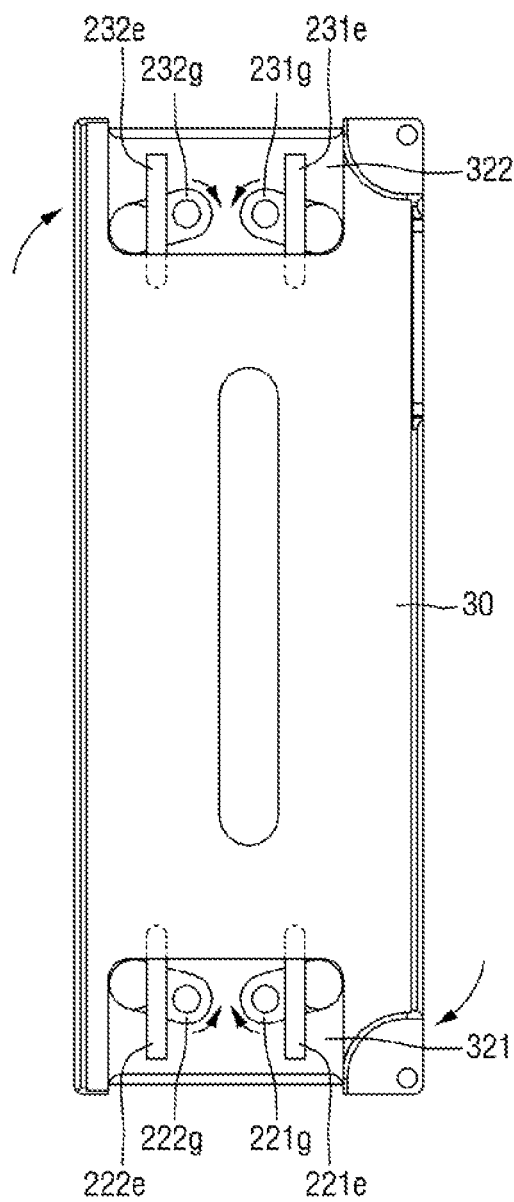

FIGS. 14 and 15 illustrate an aligning part included in a first finger unit of a gripper according to an exemplary embodiment of the present inventive concept. FIGS. 16 and 17 illustrate a magazine and aligning parts included in finger units of a gripper according to an exemplary embodiment of the present inventive concept.

Descriptions of components that are the same or substantially the same as those described above may be omitted below.

Referring to FIGS. 14 and 15, the first finger unit 221 may include the first finger 221e, the first aligning part 221g, and the third tension spring 53.

When the first finger 221e is inserted into the first opening 321 (see, e.g., FIG. 2) of the magazine 30 (see, e.g., FIG. 2), the first aligning part 221g may be rotated by a first angle away from the first finger 221e about a first alignment rotation shaft 221f. The first alignment rotation shaft 221f may extend along the Z axis.

The third tension spring 53 may control the rotation of the first aligning part 221g so that it does not rotate beyond a predetermined angle.

While the first finger unit 221 has been described above with reference to FIGS. 14 and 15, the second finger unit 222 (see, e.g., FIG. 3), the third finger unit 231 (see, e.g., FIG. 3) and the fourth finger unit 232 (see, e.g., FIG. 3) may also include the same elements as those of the first finger unit 221 and may operate in substantially the same manner as the first finger unit 221, and thus duplicative descriptions may be omitted herein.

For example, the second finger unit 222 may include a second aligning part that rotates by a first angle in the direction away from the first finger about the second alignment rotation shaft when the second finger is inserted into the first opening of the magazine. The third finger unit 231 may include a third aligning part that rotates by the first angle in the direction away from the fourth finger about the third alignment rotation shaft when the third finger is inserted into the second opening of the magazine. The fourth finger unit may include a fourth aligning part that rotates by the first angle in the direction away from the third finger about the fourth alignment rotation shaft when the fourth finger is inserted into the second opening of the magazine.

If the magazine 30 is not aligned along a predetermine direction (see, e.g., FIG. 16), the fingers might not be inserted properly into the top plate 32 of the magazine 30 (see, e.g., FIG. 2). When this happens, the gripper 20 may shift the position of the magazine 30 to align the magazine 30 using the aligning parts included in each of the first gripping unit 22 and the second gripping unit 23 (see, e.g., FIG. 3).

For example, referring to FIG. 16, when the first finger 221e and the second finger 222e are inserted into the first opening 321, the first aligning part 221g and the second aligning part 222g may be inserted into the first opening 321 (e.g., at substantially the same time).

In addition, when the third finger 231e and the fourth finger 232e are inserted into the second opening 322, the third aligning part 231g and the fourth aligning part 232g may be inserted into the second opening 322 (e.g., at substantially the same time).

Referring to FIG. 17, as the first finger 221e is inserted into the first opening 321, the first aligning part 221g may be rotated by the first angle away from the second finger 222e about the first alignment rotation shaft. In addition, as the second finger 222e is inserted into the first opening 321, the second aligning part 222g may be rotated by the first angle away from the first finger 221e about the second alignment rotation shaft.

In addition, as the third finger 231e is inserted into the second opening 322, the third aligning part 231g may be rotated by the first angle away from the fourth finger 232e about the third alignment rotation shaft. In addition, as the fourth finger 232e is inserted into the second opening 322, the fourth aligning part 232g may be rotated by the first angle away from the third finger 231e about the fourth alignment rotation shaft.

As the first aligning part 221g, the second aligning part 222g, the third aligning part 231g and the fourth aligning part 232g rotate in the first and second openings, the magazine 30 is moved such that the first finger 221e, the second finger 222e, the third finger 231e and the fourth finger 232e can be inserted into the first opening 321 and the second opening 322 properly. Thus, the magazine 30 can be aligned with the gripper 20.

According to an exemplary embodiment of the present inventive concept, even if the magazine 30 having a plurality of printed circuit boards P loaded therein stands at a position slightly deviated from the desired position, the magazine 30 can be aligned by the gripper 20.

Figure 18:
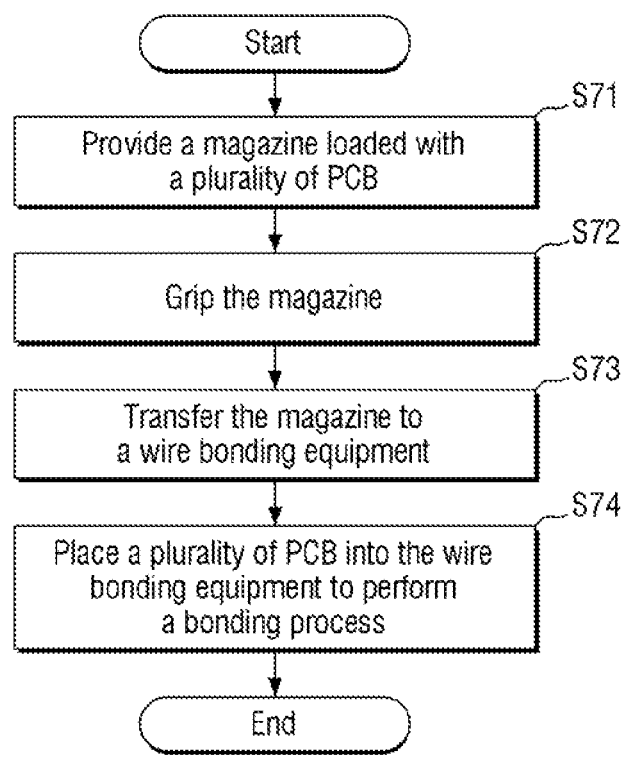
FIG. 18 is a flowchart of a method for fabricating a semiconductor device using a gripper according to an exemplary embodiment of the present inventive concept.

FIG. 18 is a flowchart of a method for fabricating a semiconductor device using a gripper according to an exemplary embodiment of the present inventive concept.

Referring to FIG. 18, the magazine 30 in which a plurality of circuit boards P is loaded may be provided (step S71). However, exemplary embodiments of the present inventive concept are not limited thereto and a plurality of wafers may be loaded in the magazine 30 instead of the printed circuit boards.

When the magazine 30 in which the printed circuit boards P are loaded is prepared in step S71, the magazine 30 may be gripped using the gripper 20 mounted on the magazine transfer robot 1 (step S72). The gripper 20 has been described in more detail above with reference to FIGS. 3 to 17, and thus duplicative descriptions may be omitted below.

When the magazine transfer robot 1 grips the magazine 30 with the gripper 20, the magazine 30 may be transferred to wire bonding equipment (step S73). To do so, the magazine transfer robot 1 itself may move.

When the magazine 30 is transferred to the wire bonding equipment in step S73, the plurality of printed circuit boards P may be placed (e.g., inserted) into the wire bonding equipment to perform a bonding process (step S74).

However, exemplary embodiments of the present inventive concept are not limited thereto. For example, the magazine 30 may be transferred to other equipment different from the equipment described above with referring to FIG. 18. Another process other than the bonding process may be performed in the other equipment.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A gripper comprising:
   a body frame mounted on a magazine transfer robot;
   a first guide assembly mounted on the body frame;
   a first gripping unit movable along the first guide assembly;
   a second gripping unit movable along the first guide assembly; and
   a driver configured to move the first gripping unit in a first direction and configured to move the second gripping unit in a second direction opposite to the first direction,
   wherein the first gripping unit comprises a first finger unit and a second finger unit independently moveable with respect to the first finger unit,
   wherein the second gripping unit is spaced apart from the first gripping unit and comprises a third finger unit and a fourth finger unit independently moveable with respect to the third finger unit, and
   wherein the first gripping unit comprises a second guide assembly configured to guide a movement of each of the first finer unit and the second finger unit,
   wherein the second gripping unit comprises a third guide assembly configured to guide a movement of each of the third finger unit and the fourth finger unit,
   wherein each of the first finger unit and the second finger unit is movable in a third direction toward the first guide assembly or in a fourth direction opposite to the third direction along the second guide assembly, and
   wherein each of the third finger unit and the fourth finger unit is movable in the third direction or in the fourth direction along the third guide assembly.

2. The gripper of claim 1, wherein the first guide assembly comprises a first pillar, a first moving block movable along the first pillar, and a second moving block movable along the first pillar,
   wherein the second guide assembly comprises a second pillar coupled with the first moving block, a first rail provided on a first surface of the second pillar, a second rail provided on a second surface, opposite the first surface, of the second pillar, a third moving block at least partially covering the first rail and coupled with the first finger unit, and a fourth moving block at least partially covering the second rail and coupled with the second finger unit, and wherein the third guide assembly comprises a third pillar coupled with the second moving block, a third rail provided on a third surface of the third pillar, a fourth rail provided on a fourth surface, opposite the third surface, of the third pillar, a fifth moving block at least partially covering the third rail and coupled with the third finger unit, and a sixth moving block at least partially covering the fourth rail and coupled with the fourth finger unit.

3. The gripper of claim 2, wherein the third moving block is movable along the first rail in the third direction or the fourth direction,
wherein the fourth moving block is movable along the second rail in the third direction or the fourth direction,
wherein the fifth moving block is movable along the third rail in the third direction or the fourth direction, and
wherein the sixth moving block is movable along the fourth rail in the third direction or the fourth direction.

4. The gripper of claim 2, wherein each of the third moving block, the fourth moving block, the fifth moving block and the sixth moving block is movable independently of one another.

5. The gripper of claim 1, wherein the first finger unit further comprises a first fixed part fixedly coupled to the second guide assembly, and a first rotating part rotatably coupled with the first fixed part and rotatable about a first rotation shaft, wherein the first rotation shaft extends along a fifth direction perpendicular to an extending direction of the first guide assembly,
wherein the second finger unit further comprises a second fixed part fixedly coupled to the second guide assembly, and a second rotating part rotatably coupled with the second fixed part and rotatable about a second rotation shaft extending along the fifth direction,
wherein the third finger unit further comprises a third fixed part fixedly coupled to the third guide assembly, and a third rotating part rotatably coupled with the third fixed part and rotatable about a third rotation shaft extending along the fifth direction, and
wherein the fourth finger unit further comprises a fourth fixed part fixedly coupled to the third guide assembly, and a fourth rotating part rotatably coupled with the fourth fixed part and rotatable about a fourth rotation shaft extending along the fifth direction.

6. The gripper of claim 5, wherein the first fixed part comprises a first stopper configured to restrict a rotation angle of the first rotating part within a predetermined angle,
wherein the second fixed part comprises a second stopper configured to restrict a rotation angle of the second rotating part within the predetermined angle,
wherein the third fixed part comprises a third stopper configured to restrict a rotation angle of the third rotating part within the predetermined angle, and
wherein the fourth fixed part comprises a fourth stopper configured to restrict a rotation angle of the fourth rotating part within the predetermined angle.

7. The gripper of claim 1, wherein the first finger unit further comprises a first finger insertable into a first opening formed on one side of a top plate of a magazine,
wherein the second finger unit further comprises a second finger insertable into the first opening,
wherein the third finger unit further comprises a third finger insertable into a second opening formed on another side of the top plate, and
wherein the fourth finger unit further comprises a fourth finger insertable into the second opening.

8. The gripper of claim 7, wherein the first finger unit further comprises a first aligning part configured to rotate by a first angle in a direction away from the second finger about a first alignment rotation shaft when the first finger is inserted into the first opening,
wherein the second finger unit further comprises a second aligning part configured to rotate by the first angle in a direction away from the first finger about a second alignment rotation shaft when the second finger is inserted into the first opening,
wherein the third finger unit further comprises a third aligning part configured to rotate by the first angle in a direction away from the fourth finger about a third alignment rotation shaft when the third finger is inserted into the second opening, and
wherein the fourth finger unit further comprises a fourth aligning part configured to rotate by the first angle in a direction away from the third finger about a fourth alignment rotation shaft when the fourth finger is inserted into the second opening.

9. The gripper of claim 1, further comprising:
a sensing unit disposed on the body frame,
wherein the sensing unit comprises:
a QR (Quick Response) code reader configured to recognize a QR code; and
a plurality of laser displacement sensors configured to sense a distance to a facility.

10. The gripper of claim 1, wherein the driver is configured to move the first gripping unit and the second gripping unit along an axis perpendicular to the first and second directions.

11. A gripper comprising:
a first guide assembly;
a first gripping unit movable along the first guide assembly; and
a second gripping unit movable along the first guide assembly,
wherein the first gripping unit comprises:
a second guide assembly coupled with the first guide assembly;
a first finger unit movable in a first direction toward the first guide assembly or in a second direction opposite to the first direction along the second guide assembly; and
a second finger unit movable in the first direction or in the second direction along the second guide assembly independently of the first finger unit, and
wherein the second gripping unit comprises:
a third guide assembly coupled with the first guide assembly;
a third finger unit movable in the first direction or in the second direction along the third guide assembly; and
a fourth finger unit movable in the first direction or in the second direction along the third guide assembly independently of the third finger unit.

12. The gripper of claim 11, further comprising:
a driver configured to move the first gripping unit in a third direction and configured to move the second gripping unit in a fourth direction opposite to the third direction.

13. The gripper of claim 11, wherein the first guide assembly comprises a first pillar, a first moving block movable along the first pillar, and a second moving block movable along the first pillar,
wherein the second guide assembly comprises a second pillar coupled with the first moving block, a first rail provided on a first surface of the second pillar, a second rail provided on a second surface, opposite the first surface, of the second pillar, a third moving block at least partially covering the first rail and coupled with the first finger unit, and a fourth moving block at least partially covering the second rail and coupled with the second finger unit, and wherein the third guide assembly comprises a third pillar coupled with the second moving block, a third rail provided on a third surface of the third pillar, a fourth rail provided on a fourth surface, opposite the third surface, of the third pillar, a fifth moving block at least partially covering the third rail and coupled with the third finger unit, and a sixth moving block at least partially covering the fourth rail and coupled with the fourth finger unit.

14. The gripper of claim 13, wherein the third moving block is movable along the first rail, wherein the fourth moving block is movable along the second rail, wherein the fifth moving block is movable along the third rail, and the sixth moving block is movable along the fourth rail.

15. The gripper of claim 13, wherein each of the third moving block, the fourth moving block, the fifth moving block and the sixth moving block is movable independently of one another.

16. The gripper of claim 11, wherein the first finger unit comprises a first fixed part fixedly coupled to the second guide assembly, and a first rotating part rotatably coupled with the first fixed part and rotatable about a first rotation shaft extending in a third direction perpendicular to an extending direction of the first guide assembly, wherein the second finger unit comprises a second fixed part fixedly coupled to the second guide assembly, and a second rotating part rotatably coupled with the first fixed part and rotatable about a second rotation shaft extending in the third direction, wherein the third finger unit comprises a third fixed part fixedly coupled to the third guide assembly, and a third rotating part rotatably coupled with the third fixed part and rotatable about a third rotation shaft extending in the third direction, and wherein the fourth finger unit comprises a fourth fixed part fixedly coupled to the third guide assembly, and a fourth rotating part rotatably coupled with the fourth fixed part and rotatable about a fourth rotation shaft extending in the third direction.

17. The gripper of claim 16, wherein the first fixed part comprises a first stopper configured to restrict a rotation angle of the first rotating part within a predetermined angle, wherein the second fixed part comprises a second stopper configured to restrict a rotation angle of the second rotating part within the predetermined angle, wherein the third fixed part comprises a third stopper configured to restrict a rotation angle of the third rotating part within the predetermined angle, and wherein the fourth fixed part comprises a fourth stopper configured to restrict a rotation angle of the fourth rotating part within the predetermined angle.

18. The gripper of claim 11, wherein the first finger unit further comprises a first finger insertable into a first opening formed on one side of a top plate of a magazine, wherein the second finger unit further comprises a second finger insertable into the first opening, wherein the third finger unit further comprises a third finger insertable into a second opening formed on another side of the top plate, and wherein the fourth finger unit further comprises a fourth finger insertable into the second opening.

19. A gripper comprising:
a body frame mounted on a magazine transfer robot;
a first guide assembly mounted on the body frame;
a first gripping unit movable along the first guide assembly;
a second gripping unit movable along the first guide assembly;
a driver configured to move the first gripping unit in a first direction and configured to move the second gripping unit in a second direction opposite to the first direction; and
a sensing unit disposed on a region of an upper end of the body frame,
wherein the first gripping unit comprises a first finger unit and a second finger unit independently moveable with respect to the first finger unit,
wherein the second gripping unit comprises a third finger unit and a fourth finger unit independently moveable with respect to the third finger unit, and
wherein the sensing unit comprises a QR (Quick Response) code reader configured to recognize a QR code attached to a facility; and a plurality of laser displacement sensors configured to sense a distance to the facility.

* * * * *